United States Patent [19]
Pankove

[11] 3,922,703
[45] Nov. 25, 1975

[54] ELECTROLUMINESCENT SEMICONDUCTOR DEVICE

[75] Inventor: Jacques Isaac Pankove, Princeton, N.J.

[73] Assignee: RCA Corporation, New York, N.Y.

[22] Filed: Apr. 3, 1974

[21] Appl. No.: 457,405

[52] U.S. Cl. .................... 357/17; 357/4; 357/18; 357/41; 357/23
[51] Int. Cl.[2] .................... H01L 33/00
[58] Field of Search .............. 357/17, 18, 4, 41, 23

[56] References Cited

UNITED STATES PATENTS

| | | | |
|---|---|---|---|
| 3,683,240 | 8/1972 | Pankove | 317/234 R |
| 3,728,591 | 4/1973 | Sunshine | 317/235 R |
| 3,745,072 | 7/1973 | Scott, Jr. | 148/175 |
| 3,783,353 | 1/1974 | Pankove | 317/235 R |
| 3,849,707 | 11/1974 | Braslau | 357/17 |

*Primary Examiner*—Martin H. Edlow
*Attorney, Agent, or Firm*—Glenn H. Bruestle; Daniel N. Calder

[57] ABSTRACT

A gallium nitride electroluminescent semiconductor element and a silicon semiconductor element are on the same substrate. The gallium nitride semiconductor element and silicon semiconductor element are electrically connected with the silicon semiconductor element as a driving or switching circuit for the gallium nitride electroluminescent semiconductor element.

6 Claims, 3 Drawing Figures

ELECTROLUMINESCENT SEMICONDUCTOR DEVICE

BACKGROUND OF THE INVENTION

The present invention relates to an electroluminescent semiconductor device in which the driving circuit is on the same substrate as the electroluminescent element.

Electroluminescent semiconductor devices in general are bodies of a single crystalline semiconductor material which when biased emit light, either visible or infrared, through the recombination of pairs of oppositely charged carriers. Electroluminescent devices have been made of the Group III-V compound semiconductor materials. A Group III-V compound semiconductor material which is suitable for making visible-light-emitting electroluminescent semiconductor devices, because of its high bandgap energy, is gallium nitride, GaN. Gallium nitride also possesses the crystalline structure that makes it suitable for growth on a sapphire or silicon substrate.

In the past, electroluminescent semiconductor devices have been driven by external circuitry to which they were connected by wires, resulting in bulky and laborconsuming packaging. Therefore, it is advantageous to fabricate compact and complex circuitry for driving such devices as GaN light emitting diodes and numeric displays on the same substrate upon which the electroluminescent element is formed.

SUMMARY OF THE INVENTION

An electroluminescent semiconductor device including a substrate with a surface. Both a gallium nitride electroluminescent semiconductor element and a silicon semiconductor element are on the surface. The gallium nitride electroluminescent semiconductor element and the silicon semiconductor element are electrically connected.

DETAILED DESCRIPTION

Figure 1:
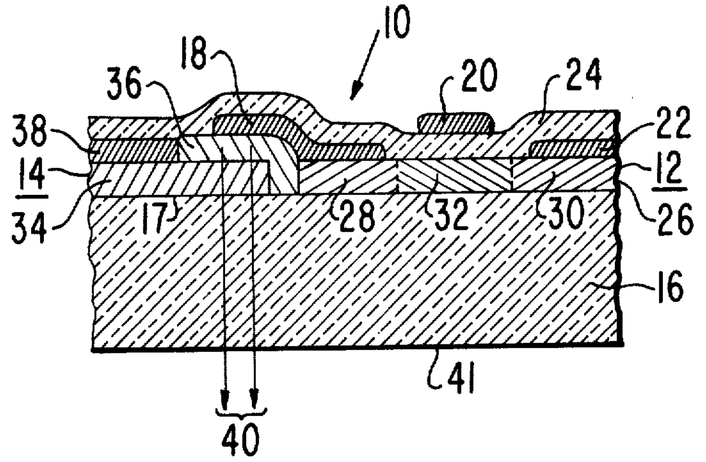
FIG. 1 is a cross-sectional view of one embodiment of the electroluminescent semiconductor device.

Referring to FIG. 1, a form of the electroluminescent semiconductor device is designated as 10. This embodiment of the present invention comprises a silicon semiconductor element 12 and a gallium nitride (GaN) electroluminescent semiconductor element 14, both on a surface 17 of a sapphire substrate 16, and electrically connected to each other. In the present invention, the gallium nitride semiconductor element 14 is a light emitting diode.

In this particular embodiment of the present invention, the silicon semiconductor element 12 is a field effect transistor (FET). The FET comprises a silicon layer 26 with three conductivity regions on surface 17. The three regions of the silicon layer 26 are a drain 28, a channel 32, and a source 30. Both the drain 28 and source 30 have a higher carrier concentration than the channel 32. A source contact 22 is on source 30, and inter-element contact 18 is on the drain 28. An insulating layer 24, typically $SiO_2$ or $Si_3N_4$, is deposited on the gallium nitride electroluminescent semiconductor element 14 and on a portion of the silicon layer 26 which includes the channel 32. A gate electrode 20 is on the insulating layer 24 directly over the channel 32. The inter-element contact 18, source contact 22 and gate electrode 20 are films of an electrically conductive metal.

The gallium nitride electroluminescent semiconductor element 14 comprises a layer of highly conductive $n^+$ type gallium nitride 34 on the substrate 16. On the $n^+$ layer 34 is a layer of insulating gallium nitride 36. The layer of insulating gallium nitride 36 is crystalline gallium nitride which has been doped by acceptor impurities, such as Zn, Be, Li or Mg. An electrode 38, of a metallic material is on the conductive gallium nitride layer 34 and is electrically connected thereto.

As previously stated, the inter-element contact 18 is electrically connected to the drain 28 of the silicon semiconductor element 12, and inter-element contact 18 also extends onto the insulating gallium nitride layer 36 of the gallium nitride semiconductor element 14, and is electrically connected thereto.

The silicon semiconductor element 12 is either the driving or switching current source for the operation of the gallium nitride electroluminescent semiconductor element 14. When the DC current of the silicon semiconductor element 12 passes through the conductive gallium nitride layer 34 and the insulating gallium nitride layer 36, then to electrode 38, a light, indicated by the rays 40, is generated in the insulating gallium nitride layer 36. The generated light 40 can be seen through the conductive gallium nitride layer 34 and the sapphire substrate 16, which are transparent.

While the silicon semiconductor element 12 is an FET in this embodiment of the present invention, any other semiconductor device which can operate as a driving or switching source can be used. It is also possible that a circuit will be used to operate the gallium nitride electroluminescent semiconductor element and have its components on the surface 17 or an opposite surface 41.

To fabricate the electroluminescent semiconductor device 10, a layer of silicon is epitaxially grown on sapphire substrate 16 by using silicon-on-sapphire (SOS) technology and masking techniques which are well known in the art. Then, that portion of the silicon layer where the gallium nitride light emitting diode is to be grown, on the substrate 16, is etched away. The remaining portion of the silicon is the silicon layer 26. By the method of diffusion or ion implantation, the layer 26 is doped with impurities. The silicon layer 26 is doped to create the three conductivity regions, 28, 30 and 32. The layer of conductive gallium nitride 34 is then grown by a chemical vapor deposition technique on a portion of the substrate 16, said portion of the substrate 16 being defined by masking with $SiO_2$ those regions where epitaxial growth of gallium nitride is not wanted. One of the chemical vapor deposition techniques used is disclosed by H. P. Maruska and J. J. Tietjen in "Preparation and Properties of Vapor-Deposited Single Crystalline GaN," APPLIED PHYSICS LETTERS, Vol. 15, No. 10, Nov. 15, 1970, pages 327–329. Next, the layer of insulating gallium nitride 36 is epitaxially grown on the remaining open portion of substrate 16 and on a portion of the conductive gallium nitride layer 34 which has not been masked with $SiO_2$. That portion of the conductive gallium nitride layer 34 which is masked is to accommodate electrode 38, which is formed next, together with contacts 18 and 22.

During the initial step of the vapor phase epitaxy technique, no acceptor impurity is included in the reacting vapors so that the initial portion of the deposited gallium nitride is conductive and forms the $n^+$ conductive gallium nitride layer 34. When the conductive gallium nitride layer 34 of desired thickness has been deposited, sufficient acceptor impurity, such as Zn, Be, Li, or Mg is included in the reacting vapors so as to deposit insulating gallium nitride and form the insulating gallium nitride layer 36.

A layer of metallic material is evaporated onto the electroluminescent semiconductor device 10. By the use of photolithography, the shape of the source contact 22, the inter-element contact 18 and the electrode 38 are defined on the layer of metallic material. The remaining portion of the metallic layer is then etched away.

Next, the insulating layer 24 is deposited on the silicon layer 26, the electrode 38, the inter-element contact 18 and the source contact 22, by chemical vapor deposition techniques well known in the art. The final step is to evaporate a layer of metallic material over the insulating layer 24, then mask the metallic layer so that by photolithography only on that portion of the metallic layer directly over the channel is allowed to remain, thus forming the gate electrode 20.

In the present invention, the combination of SOS and gallium nitride technologies makes possible new and improved devices such as a numeric display in which the decoder and the driver can be built on the same chip as the electroluminescent display. Also made possible by the present invention is a flying spot scanner which consists of a linear array of light emitting diodes adjacent to a shift register. The scanning of a whole raster is possible with a two-dimensional array. In this particular device, a two-dimensional picture can be generated by modulating the bias applied across all the light emitting diodes while only the element addressed by the shift register is allowed to light up with an intensity determined by the modulated bias.

The present embodiment of the electroluminescent semiconductor device 10 allows the device to be encapsulated, such that only the substrate 16 is exposed to the environment without preventing the emission of generated light 40 from the encapsulated device.

Figure 2:
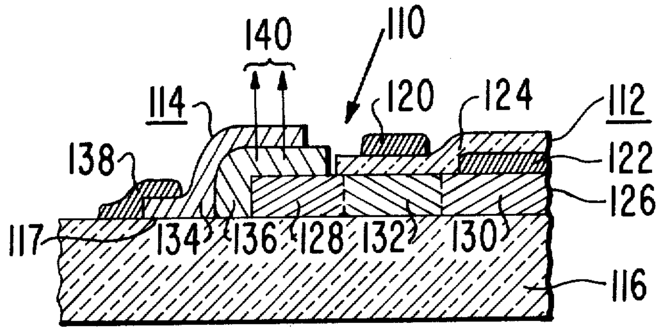
FIG. 2 is a cross-sectional view of a second embodiment of the electroluminescent semiconductor device.

Referring to FIG. 2, another form of the electroluminescent semiconductor device is designated as 110. Electroluminescent semiconductor device 110 includes a silicon semiconductor element 112 and a gallium nitride electroluminescent semiconductor element 114, both of which are on a sapphire substrate 116 at surface 117. While the physical structure of the electroluminescent semiconductor device 110 is similar to the electroluminescent semiconductor device 10, the two devices differ in at least one respect.

The silicon semiconductor element 112 is an FET in the second embodiment of the present invention. The silicon semiconductor element 112 comprises a silicon layer 126 which has three conductivity regions, the drain 128, the channel 132 and the source 130, a source contact 122, an insulating layer 124, and a gate electrode 120. These elements of the silicon semiconductor element 112 are the same as the silicon layer 26 with a drain 28, a channel 32 and a source 30, the source contact 22, the insulated layer 24, and the gate electrode 20 of the silicon semiconductor element 12, respectively.

The gallium nitride electroluminescent semiconductor element 114 comprises a layer of $n^+$ highly conductive gallium nitride 134, a layer of insulating gallium nitride 136 and an electrode 138. These elements of the gallium nitride electroluminescent semiconductor element 114 are the same as the $n^+$ highly conductive gallium nitride layer 34, the insulating gallium nitride layer 36 and electrode 38 of gallium nitride semiconductor element 14, respectively.

Substrate 116 of electroluminescent semiconductor device 110 is the same as substrate 16 of electroluminescent semiconductor device 10.

The structural difference between electroluminescent semiconductor devices 10 and 110 is that device 110 does not have an inter-semiconductor contact from the silicon semiconductor element 12 to the gallium nitride semiconductor element 14, forming an electrical connection therebetween. In the electroluminescent semiconductor device 110, the insulating gallium nitride layer 136 is epitaxially grown on a portion of the substrate 116 and on the drain 128. Therefore, the gallium nitride electroluminescent semiconductor element 114 and the silicon semiconductor element 112 are electrically connected to each other by the contact between the insulating gallium nitride layer 136 and the drain 128.

In the fabrication of the second embodiment of the present invention, the techniques and procedures used are very similar to those used in the fabrication of the first embodiment of the present invention. A layer of silicon is epitaxially grown on the substrate 116 and a portion of this silicon layer is etched away to provide space for the gallium nitride semiconductor element 114. The remaining portion of the silicon is silicon layer 126. The silicon layer 126 is doped by the same techniques as used to dope silicon layer 26.

Unlike the fabrication of device 10, the next step in the fabrication of device 110 is to grow, by chemical deposition, a layer of insulating gallium nitride on the drain 128 and on a portion of the substrate 116. The same chemical vapor deposition technique used for the first embodiment is also used in the second embodiment of the present invention. Before growing the insulating gallium nitride layer 136, that portion of the silicon layer 126 and the substrate 116 on which the layer 136 is not to be grown, is masked with $SiO_2$.

The chemical vapor deposition techinque is next used to grow epitaxially the conducting gallium nitride layer 134.

As is done in the fabrication of the electroluminescent semiconductor device 10, a layer of metallic material is evaporated on the electroluminescent semiconductor device 110, and by masking with photoresist and subsequent etching, the electrode 138 and source contact 122 are formed.

Next, the insulating layer 124 is deposited. Unlike in the fabrication of the electroluminescent semiconductor device 10, the insulating layer 124 is deposited only on the source contact 122 and channel 132.

As in the fabrication of the electroluminescent semiconductor device 10, the final step of fabrication is to evaporate a layer of metallic material on the electroluminescent semiconductor device 110 and by masking with photoresist and then etching, the gate electrode 120 is formed.

Unlike the first embodiment of the present invention, light rays 140, generated in the insulating gallium nitride layer 136, travel in a direction which takes them through only the conductive gallium nitride layer 134.

Figure 3:
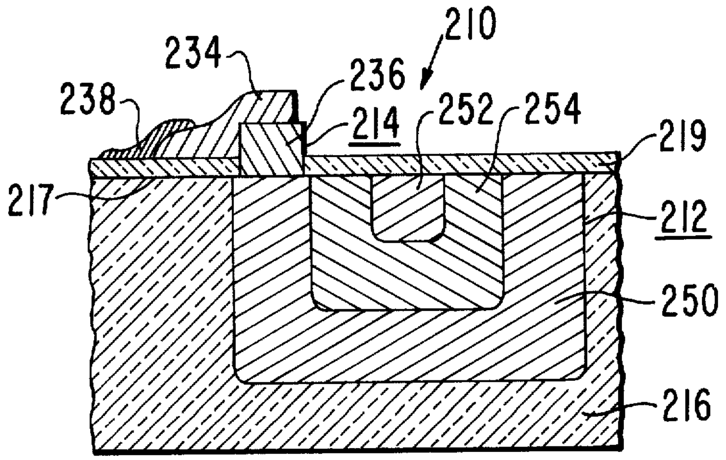
FIG. 3 is a cross-sectional view of a third embodiment of the electroluminescent semiconductor device.

Referring to FIG. 3, a third form of the electroluminescent semiconductor device is designated 210. Electroluminescent semiconductor device 210 includes a silicon semiconductor element 212 and a gallium nitride electroluminescent semiconductor element 214. The third embodiment of the present invention differs from the first two embodiments in that the silicon semiconductor element 212 is in a silicon substrate 216 at a surface 217 and the gallium nitride electroluminescent semiconductor element 214 is on the surface 217 of the substrate 216.

The silicon semiconductor element 212 is a bipolar transistor in the third embodiment of the present invention. The silicon semiconductor element 212 comprises two *n* type conductivity layers which are inner layer 252 and outer layer 250, and *p* type conductivity layer 254. The three conductivity layers are at surface 217 with inner *n* type layer 252 partially surrounded by outer *n* type layer 250. Inner *n* type layer 252 is at the surface 217 at one section, but layers 250 and 254 are each at the surface 217 at two sections. Although the silicon semiconductor element 212 is a transistor in the third embodiment of the present invention, any other driving or current switching device such as an FET, a thyristor, photoconductor or source of energy such as photovoltaic, electron voltaic or radio-voltaic cell can be incorporated in the silicon substrate 216.

The gallium nitride electroluminescent semiconductor element 214 comprises a layer of $n^+$ highly conductive gallium nitride 234, a layer of insulating gallium nitride 236 and an electrode 238. These elements of the gallium nitride electroluminescent semiconductor element 214 are the same as the $n^+$ highly conductive gallium nitride layer 34, the insulating gallium nitride layer 36 and the electrode 38 of the gallium nitride electroluminescent semiconductor element 14, respectively.

The gallium nitride electroluminescent semiconductor element 214 and the silicon semiconductor element 212 are electrically connected to each other by virtue of the insulating gallium nitride layer 236 being contiguous to the outer *n* type conductivity layer 250. The gallium nitride electroluminescent semiconductor element 214 is electrically insulated from the remaining portion of the silicon semiconductor element 212 by an insulating layer 219. The insulating layer 219 is of $SiO_2$ or $Si_3N_4$.

In the fabrication of the third embodiment of the present invention, any driving or switching device can be formed in the silicon substrate 216 at the surface 217, by photolithographic techniques such as ion implantation and diffusion. Therefore, after the silicon semiconductor element 212 has been formed, an insulating layer of $SiO_2$ or $Si_3N_4$ is deposited on the surface 217. A portion of the insulating layer contiguous to one section of the outer n type conductivity layer 250 at the surface 217 is etched away, what remains is insulating layer 219. The layer of insulating gallium nitride 236 is then formed on surface 217 where the insulating layer 219 was etched away. The layer of conductive gallium nitride 234 is then formed partially on insulating gallium nitride layer 236 and partially on insulating layer 219. Next, the electrode 238 is formed partially on conductive gallium nitride layer 234 and partially on insulating layer 219. These elements of the gallium nitride electroluminescent semiconductor element 214 are formed by the same techniques used in the first and second embodiments of the present invention.

Though not shown in FIG. 3, photosensitive devices at the surface 217 can receive light incident on the device 210. Even those regions of the surface 217 which are covered by gallium nitride are illuminated because the insulating gallium nitride layer 236 is transparent to visible and near infrared light. These photosensitive devices may be intended for the conversion of radiant energy into electrical energy or as radiation sensors. In addition, these energy convertors and radiation sensors could be operated in conjunction with the gallium nitride electroluminescent semiconductor element 214, shown in FIG. 3.

Gallium nitride grown directly on silicon has exhibited the same crystallinity and photoluminescent properties as gallium nitride grown on sapphire. Therefore, the new and improved devices made possible by the first embodiment of the present invention are also possible with the second and third embodiments.

I claim:

1. An electroluminescent semiconductor device comprising:

a transparent substrate with a surface;

a silicon semiconductor element at said surface; and a gallium nitride electroluminescent semiconductor element on said surface, electrically connected to said silicon semiconductor element, and having;

a. a layer of $n^+$ highly conductive gallium nitride on said substrate:

b. an insulating layer of gallium nitride on said conductive gallium nitride layer and on said substrate, such that light generated in said insulating gallium nitride layer passes through said conductive gallium nitride layer and said substrate and is emitted from said device;

c. an electrode on said layer of conductive gallium nitride; and d. an inter-element contact on said layer of insulating gallium nitride and said silicon semiconductor element, electrically connecting said gallium nitride electroluminescent semiconductor element to said silicon semiconductor element.

2. The electroluminescent semiconductor device in accordance with claim 1 in which said silicon semiconductor element is a field-effect transistor comprising:

a silicon layer with three conductivity regions on said transparent substrate, said three conductivity regions are a drain, a channel and a source;

a source contact on said source region;

said inter-element contact is on said drain region and said gallium nitride electroluminescent semiconductor element;

a layer of insulating material on said silicon layer; and a gate electrode on said layer of insulating material directly over said channel region.

3. The electroluminescent semiconductor device in accordance with claim 2 in which said substrate is transparent sapphire.

4. An electroluminescent semiconductor device comprising:

a substrate with a surface;

a silicon semiconductor element at said surface; and a gallium nitride electroluminescent semiconductor element on said surface, electrically connected to said silicon semiconductor element, and having;

a. a layer of insulating gallium nitride on said substrate and said silicon semiconductor element, forming electrical connections with said silicon semiconductor elements;

b. a layer of conductive gallium nitride on said insulating gallium nitride layer and said substrate, such that light generated in said insulating gallium nitride layer passes through said conductive layer of gallium nitride; and c. an electrode on said conductive gallium nitride layer and said substrate.

5. The electroluminescent semiconductor device in accordance with claim 4 in which said silicon semiconductor element is a field-effect transistor having a layer of single crystalline silicon with three conductivity regions, said three conductivity regions are a drain, a channel and source, and said layer of insulating gallium nitride is on said drain region, forming an electrical contact therebetween.

6. The electroluminescent semiconductor device in accordance with claim 5 in which said substrate is transparent sapphire.

* * * * *